(12) United States Patent
Sarata et al.

(10) Patent No.: US 9,503,048 B2
(45) Date of Patent: Nov. 22, 2016

(54) PIEZOELECTRIC VIBRATING REED AND PIEZOELECTRIC VIBRATOR

(71) Applicant: SII Crystal Technology Inc., Chiba-shi, Chiba (JP)

(72) Inventors: Takafumi Sarata, Chiba (JP); Saiichirou Ohtsuka, Chiba (JP); Yoshikazu Kato, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 14/945,958

(22) Filed: Nov. 19, 2015

(65) Prior Publication Data

US 2016/0149555 A1    May 26, 2016

(30) Foreign Application Priority Data

Nov. 21, 2014 (JP) ................... 2014-237009
Sep. 18, 2015 (JP) ................... 2015-185769

(51) Int. Cl.
| | | |
|---|---|---|
| *H01L 41/08* | (2006.01) | |
| *H03H 9/19* | (2006.01) | |
| *H01L 41/053* | (2006.01) | |
| *H03H 9/10* | (2006.01) | |

(52) U.S. Cl.
CPC .............. *H03H 9/19* (2013.01); *H01L 41/053* (2013.01); *H03H 9/1021* (2013.01)

(58) Field of Classification Search
CPC ....... H03H 9/19; H03H 9/053; H03H 9/1136
USPC ................................ 310/330–332
See application file for complete search history.

(56) References Cited

U.S. PATENT DOCUMENTS

| | | | | |
|---|---|---|---|---|
| 4,350,918 A * | 9/1982 | Sato | ....................... | G04F 5/063 310/320 |
| 2012/0032563 A1* | 2/2012 | Shimao | .............. | H03H 9/02023 310/344 |
| 2012/0056514 A1* | 3/2012 | Ishikawa | ............ | H03H 9/02157 310/344 |
| 2014/0265735 A1* | 9/2014 | Asano | .................. | H03H 9/1021 310/365 |
| 2014/0340163 A1* | 11/2014 | Kubota | ................. | H01L 41/053 331/158 |
| 2014/0368089 A1* | 12/2014 | Omomo | ................... | H03H 3/02 310/348 |
| 2015/0158184 A1* | 6/2015 | Kamijo | .................. | H02N 2/004 74/490.05 |
| 2016/0036413 A1* | 2/2016 | Yamashita | ............... | H03H 9/19 331/158 |

FOREIGN PATENT DOCUMENTS

JP        2014-116388 A       6/2014

* cited by examiner

*Primary Examiner* — J. San Martin
(74) *Attorney, Agent, or Firm* — Brinks Gilson & Lione

(57) ABSTRACT

To provide a small-sized piezoelectric vibrating reed and a piezoelectric vibrator with excellent durability. The piezoelectric vibrating reed includes a piezoelectric plate having a rectangular shape, a vibrating portion formed on a principal surface of the piezoelectric plate and a pair of mount portions for mounting the piezoelectric plate. The pair of mount portions are formed at both end portions of the piezoelectric plate in a longitudinal direction. The piezoelectric vibrator includes the piezoelectric vibrating reed and a package on which the mount portions of the piezoelectric vibrating reed are mounted.

8 Claims, 6 Drawing Sheets

PIEZOELECTRIC VIBRATING REED AND PIEZOELECTRIC VIBRATOR

RELATED APPLICATIONS

This application claims priority under 35 U.S.C. §119 to Japanese Patent Application Nos. 2014-0237009 filed on Nov. 21, 2014 and 2015-185769 filed on Sep. 18, 2015, the entire contents of which are hereby incorporated by reference.

BACKGROUND OF THE INVENTION

1. Field of the Invention

The present invention relates to a piezoelectric vibrating reed and a piezoelectric vibrator.

2. Description of Related Art

In a cellular phone, a portable information terminal device, a radio clock and the like, a piezoelectric vibrator formed of, for example, crystal is used as a time source, a timing source of a control signal, a reference signal source and so on. In a related-art piezoelectric vibrator, a piezoelectric vibrating reed is installed in a state of being fixed in a package by a conductive adhesive for mounting.

For example, a piezoelectric vibrator in which a rectangular-shaped piezoelectric vibrating reed is cantilever-supported in the package is described in JP-A-2014-116388 (Patent Document 1).

SUMMARY OF THE INVENTION

In the piezoelectric vibrator described in Patent Document 1, the piezoelectric vibrating reed is mounted on the package in mount portions at end portions of the piezoelectric vibrator in the longitudinal direction. Accordingly, when an outer force such as an impact is acted on the piezoelectric vibrator, the large moment is applied to the piezoelectric vibrating reed and the piezoelectric vibrating reed may be peeled off from the package at the mount portions. In particular, when the area of the mount portions is reduced as the size of the piezoelectric vibrating reed becomes small, the peeling in the mount portions tend to occur more frequently. Accordingly, there is a problem that the durability is reduced along with the size reduction in the piezoelectric vibrator and the piezoelectric vibrating reed in related art.

In view of the above, an object of the present invention is to provide a small-sized piezoelectric vibrating reed and a piezoelectric vibrator with excellent durability.

According to an embodiment of the present invention, there is provided a piezoelectric vibrating reed including a piezoelectric plate having a rectangular shape, a vibrating portion formed on a principal surface of the piezoelectric plate and a pair of mount portions for mounting the piezoelectric plate, in which the pair of mount portions are formed at both end portions of the piezoelectric plate in a longitudinal direction. It is further preferable that the pair of mount portions are formed in the vicinity of corner portions at one end portions of the piezoelectric plate in a short direction.

According to the embodiment of the present invention, the rectangular piezoelectric plate is supported by the pair of mount portions formed in one end portions of the piezoelectric plate in the short direction at the time of mounting the piezoelectric vibrating reed, therefore, the moment around the mount portions is reduced as compared with a case where the piezoelectric plate is supported in one end portions of the longitudinal direction as in the related-art structure. Accordingly, as the stress applied to the mount portions is reduced by the above structure, it is possible to suppress damage occurring in the mount portions even when the mount portions are reduced in size due to the size reduction of the piezoelectric vibrating reed and the fixing force is reduced at the time of mounting. Therefore, the small-sized piezoelectric vibrating reed with excellent durability can be obtained.

In the piezoelectric vibrating reed, the vibrating portion may be formed to be thinner than the mount portions at least around the mount portions.

According to the present invention, the piezoelectric vibrating reed can alleviate the stress acting on the mount portions by the vibrating portion which is formed to be thinner even when the moment around the mount portions is generated in a state of being mounted on the package. Therefore, the piezoelectric vibrating reed with more excellent durability can be obtained.

In the piezoelectric vibrating reed, the piezoelectric plate may be formed of an AT-cut quartz substrate, and the longitudinal direction of the piezoelectric plate may extend along a Z' axis direction of the AT-cut quartz substrate.

The thickness slip vibration which is a main vibration mode of the AT-cut quartz substrate is the vibration largely displaced in the X axis direction. Accordingly, when the piezoelectric vibrating reed 10 is cantilever-supported at two points along the Z' axis direction orthogonal to the X axis direction, the mount portions do not prevent the displacement of the vibrating portion in the X axis direction. When the mount portions prevent the displacement of the vibrating portion, unnecessary vibration tends to occur in the vibrating portion and the mount portions, as a result, it becomes difficult to obtain desired vibration characteristics. According to the structure of the embodiment, the arrangement direction of the mount portions is orthogonal to the displacement direction of the vibrating portion, therefore, it is possible to remarkably reduce the occurrence of unnecessary vibration as compared with the case where these directions are the same direction. Therefore, the piezoelectric vibrating reed with excellent vibration characteristics can be obtained.

In the piezoelectric vibrating reed, an external dimension of the piezoelectric plate along the longitudinal direction may be 1.4 times or less of an external dimension of the piezoelectric plate along the short direction.

According to the present invention, the external dimension of the piezoelectric plate in the longitudinal direction is 1.4 times or less of the external dimension in the short direction, therefore, the piezoelectric vibrating reed is suitable to be mounted on, for example, a small-sized package having an approximately square shape in plan view.

In the piezoelectric vibrating reed, the mount portions may protrude from the piezoelectric plate along a plane direction of the piezoelectric plate.

According to the present invention, the mount portions protrude from the piezoelectric plate, therefore, it is possible to suppress the mount member such as a conductive paste adhering to the piezoelectric plate when the mount member leaks and spreads at the time of mounting the piezoelectric vibrating reed. Therefore, the piezoelectric vibrating reed with excellent vibration characteristics can be obtained.

According to the embodiment of the present invention, there is provided a piezoelectric vibrator including the above piezoelectric vibrating reed and a package on which the mount portions of the piezoelectric vibrating reed are mounted.

According to the present invention, as the piezoelectric vibrating reed is included, therefore, the small-sized piezoelectric vibrating reed with excellent durability can be obtained.

The piezoelectric vibrator may further include a mount member arranged between the mount portions of the piezoelectric vibrating reed and the package for mounting the mount portions on the package, in which the mount member may contact principal surfaces of the mount portions and side surfaces of the mount portions.

According to the present invention, the piezoelectric vibrating reed is fixed from at least two directions by the mount member, therefore, the piezoelectric vibrating reed and the mount member firmly fixed to each other are hardly peeled off. Therefore, the piezoelectric vibrator with more excellent durability can be obtained.

When the piezoelectric vibrating reed according to the present invention is used, the rectangular piezoelectric plate is supported by the pair of mount portions formed in one end portions of the piezoelectric plate in the short direction at the time of mounting the piezoelectric vibrating reed, therefore, the moment around the mount portions is reduced as compared with a case where the piezoelectric plate is supported in one end portions of the longitudinal direction as in the related-art structure. As the stress applied to the mount portions is reduced by the above structure, it is possible to suppress damage occurring in the mount portions even when the mount portions are reduced in size due to the size reduction of the piezoelectric vibrating reed and the fixing force is reduced at the time of mounting. Therefore, the small-sized piezoelectric vibrating reed with excellent durability can be obtained.

DETAILED DESCRIPTION OF THE PREFERRED EMBODIMENTS

Figure 1:
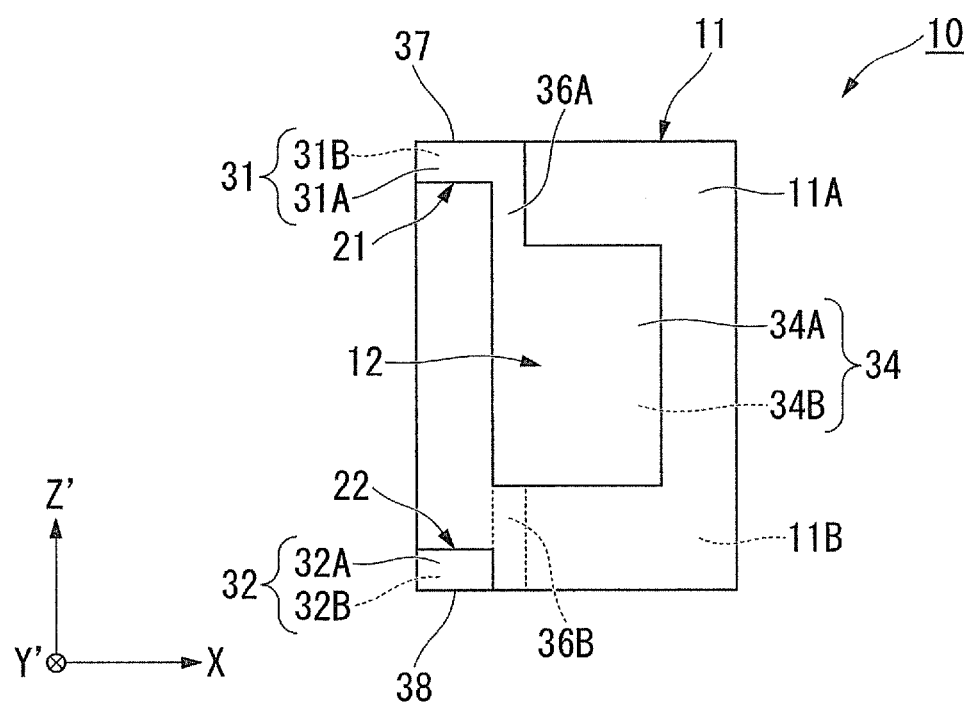
FIG. 1 is a plan view of a piezoelectric vibrating reed according to a first embodiment.

Hereinafter, embodiments of the present invention will be explained with reference to the drawings. When structures of respective drawings are explained, an XY'Z' coordinate system is used. Respective axes of the XY'Z' coordinate system have the following relations with respect to crystal axes of quartz crystal. That is, an X axis is an electrical axis, a Z' axis is an axis which is 35 degrees and 15 minutes inclined around the X axis with respect to Z axis as an optical axis, and Y' axis is an axis orthogonal to X axis and Z' axis. An X axis direction, a Y' axis direction and a Z' axis direction are explained by regarding directions of arrows in the drawings as positive directions and regarding directions opposite to arrows as negative directions.

First Embodiment

First, a piezoelectric vibrating reed and a piezoelectric vibrator according to a first embodiment will be explained.

FIG. 1 is a plan view of the piezoelectric vibrating reed according to the first embodiment.

As shown in FIG. 1, a piezoelectric vibrating reed 10 includes a piezoelectric plate 11, mount electrodes 31, 32 and excitation electrodes 34.

The piezoelectric plate 11 is formed in a rectangular shape in plan view by using an AT-cut quartz substrate. Here, the AT-cut is a process method of cutting the substrate in a direction (Z' axis direction) 35 degrees and 15 minutes inclined around the X axis with respect to Z axis in three crystal axes of artificial quartz crystal which are an electrical axis (X axis), a mechanical axis (Y axis) and the optical axis (Z axis). The piezoelectric vibrating reed 10 having the piezoelectric plate 11 cut by the AT-cut has advantages that frequency temperature characteristics are stable, that the structure and the shape are simple and processing can be easily performed and that a CI value is low. The piezoelectric plate 11 is formed so that the longitudinal direction is extended along the Z' axis direction, an external dimension of which in the longitudinal direction (Z' axis direction) is 1.4 times or less of an external dimension in the short direction (X axis direction). In the piezoelectric plate 11, the Y' axis direction corresponds to a thickness direction, and principal surfaces 11A and 11B are included on both surfaces in the Y' axis direction.

The piezoelectric plate 11 is provided with a vibrating portion 12 and a pair of mount portions 21 and 22 for mounting the piezoelectric plate 11. The vibrating portion 12 is formed in a rectangular shape in plan view so that the longitudinal direction extends along the Z' axis direction. The vibrating portion 12 is provided with one excitation electrode 34A formed on one principal surface 11A of the piezoelectric plate 11 and the other excitation electrode 34B formed on the other principal surface 11B. One excitation electrode 34A is formed in a rectangular shape in plan view at the approximately center of the vibrating portion 12. The other excitation electrode 34B is formed so as to overlap with one excitation electrode 34A formed on one principal surface 11A in plan view. In such structure, the thickness slip vibration in the X axis direction can be realized in the piezoelectric plate 11 by applying a voltage to the excitation electrodes 34A and 34B.

The pair of mount portions 21 and 22 are formed in one end portions of the short direction (X axis direction) of the piezoelectric plate 11, which are both end portions of the longitudinal direction (Z' axis direction).

The first mount portion 21 is formed at a corner positioned in a (−X', +Z') direction seen from approximately the center of the piezoelectric plate 11 in plan view. The first mount portion 21 includes one first mount electrode 31A formed on one principal surface 11A of the piezoelectric plate 11 and the other first mount electrode 31B formed on the other principal surface 11B. The one mount first electrode 31A is formed in a rectangular shape in plan view and connected to the one excitation electrode 34A through a lead wiring 36A. The other first mount electrode 31B is formed so as to overlap with the one first mount electrode 31A in plan view.

The one mount first electrode 31A and the other first electrode 31B are connected to each other through a first side surface electrode 37 formed on a side surface facing a −X direction of the first mount electrode 21 and a side surface facing +Z' direction.

The second mount portion 22 is formed at a corner positioned in a (−X, −Z') direction seen from approximately the center of the piezoelectric plate 11 in plan view. The second mount portion 22 includes one second mount electrode 32A formed on one principal surface 11A of the piezoelectric plate 11 and the other second mount electrode 32B formed on the other principal surface 11B. The one second mount electrode 32A is formed in a rectangular shape in plan view. The other second mount electrode 32B is formed so as to overlap with the one second mount electrode 32A in plan view. The other second mount electrode 32B is connected to the other excitation electrode 34B through a lead wiring 36B.

The one mount second electrode 32A and the other second electrode 32B are connected to each other through a second side surface electrode 38 formed on a side surface facing the −X direction of the second mount electrode 22 and a side surface facing −Z' direction.

Subsequently, the piezoelectric vibrator 1 having the piezoelectric vibrating reed 10 will be explained.

Figure 2:
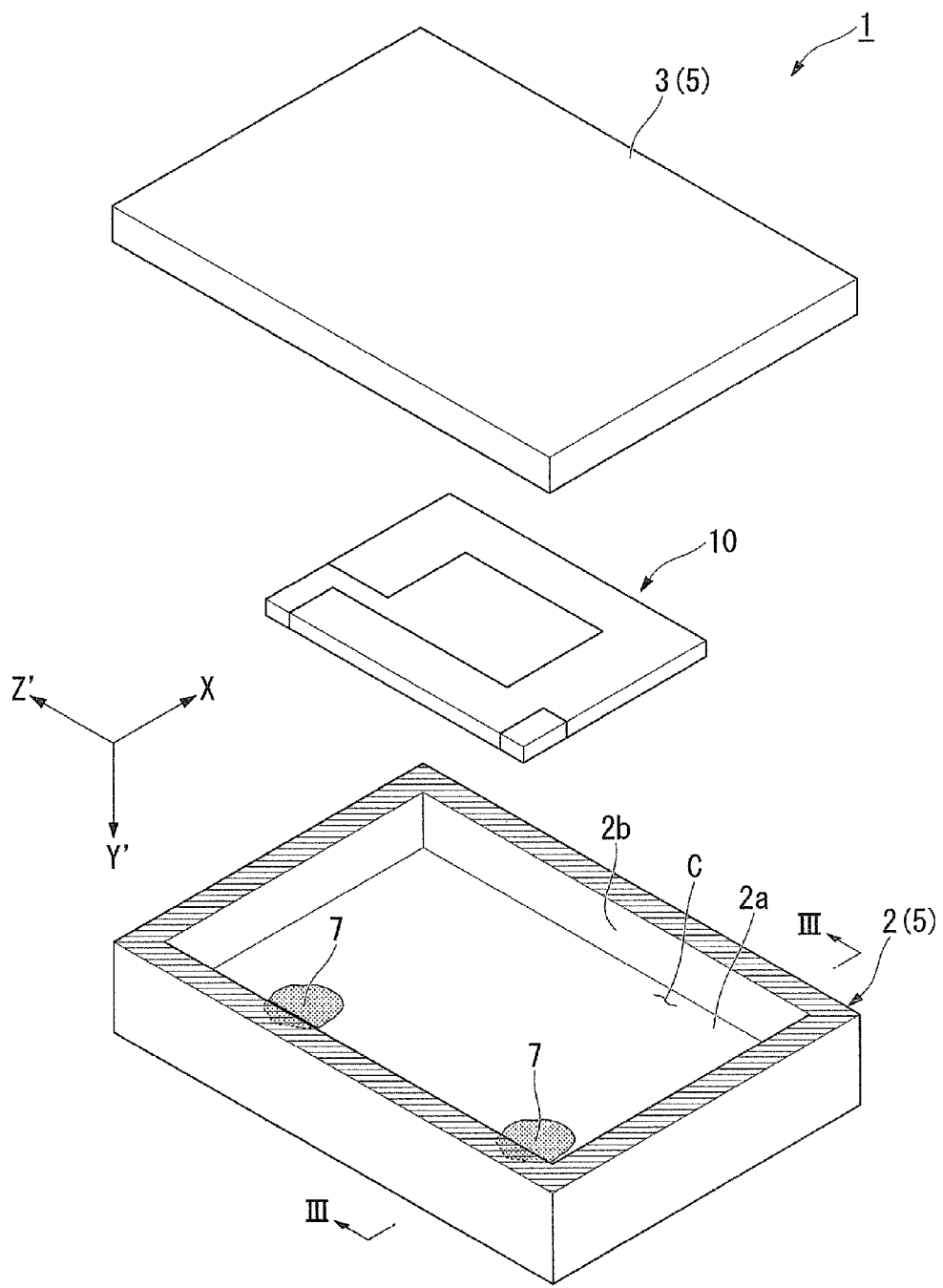
FIG. 2 is an exploded perspective view of a piezoelectric vibrator according to the first embodiment.
Figure 3:
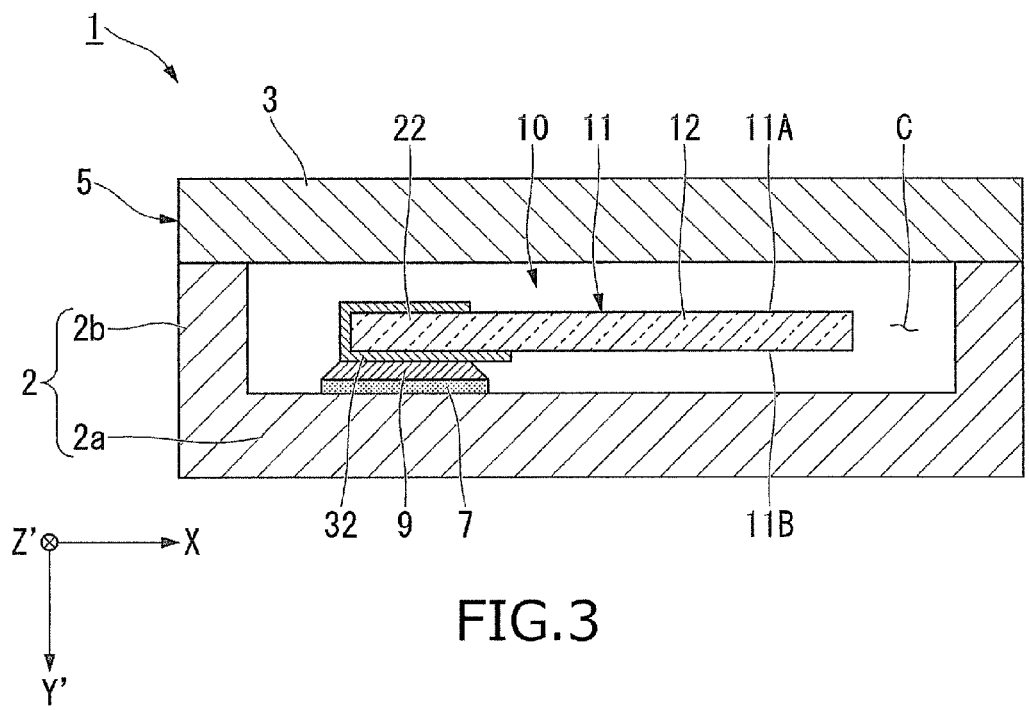
FIG. 3 is a cross-sectional view taken along III-III line of FIG. 2.

FIG. 2 is an exploded perspective view of the piezoelectric vibrator according to the first embodiment. FIG. 3 is a cross-sectional view taken along line of FIG. 2. In FIG. 3, a thickness of the second mount electrode 32 is shown in an exaggerated manner in FIG. 3 for making the explanation easy to understand (the same applies to the following cross-sectional views).

As shown in FIG. 2, the piezoelectric vibrator 1 according to the embodiment houses the piezoelectric vibrating reed 10 inside a cavity C of a package 5. The package 5 is formed by stacking the base substrate 2 and a lid substrate 3.

The base substrate 2 includes a bottom wall portion 2a formed in a rectangular plate shape and a side wall portion 2b provided to stand from a peripheral edge portion of the bottom wall portion 2a. The bottom wall portion 2a and the side wall portion 2b are formed of a ceramic substrate and so on.

A pair of internal electrodes 7 is formed on a surface of the bottom wall portion 2a in the cavity C. The pair of internal electrodes 7 are formed at an interval in a given direction. A pair of external electrodes (not shown) is formed on a surface of the bottom wall portion 2a outside the cavity C. Then, the internal electrodes 7 and the external electrode are connected by a through electrode (not shown) penetrating the bottom wall portion 2a in the thickness direction. The connecting state between the internal electrodes 7 and the external electrode is not limited to the above. For example, the internal electrodes 7 and the external electrode may be connected through the wiring extending in a plane direction of a ceramic sheet.

The lid substrate 3 is formed in a rectangular plate shape by using a ceramic material and so on. A peripheral edge portion of the lid substrate 3 is bonded to an end surface of the side wall portion 2b of the base substrate 2. Then, the cavity C is formed in a region surrounded by the bottom wall portion 2a and the side wall portion 2b of the base substrate 2 and the lid substrate 3.

As shown in FIG. 3, the piezoelectric vibrating reed 10 is housed in the cavity C. The piezoelectric vibrating reed 10 is mounted on the bottom wall portion 2a of the base substrate 2 through a mount member 9 such as a conductive paste. More specifically, the first mount electrode 31 and the second mount electrode 32 included in the pair of mount portions 21 and 22 of the piezoelectric vibrating reed 10 are mounted on the pair of internal electrodes 7 formed in the bottom wall portion 2a of the base substrate 2 through the mount member 9. Accordingly, the piezoelectric vibrating reed 10 is mechanically held in the package 5 as well as the first mount electrode 31 and the second mount electrode 32 are electrically connected to the internal electrodes 7 respectively.

Accordingly, the piezoelectric vibrating reed 10 according to the present embodiment includes the piezoelectric plate 11 formed in a rectangular shape, the vibrating portion 12 formed in the central region of the principal surface of the piezoelectric plate 11 and the pair of mount portions 21 and 22 for mounting the piezoelectric plate 11, in which the pair of mount portions 21 and 22 are formed in one end portions of the short direction in the piezoelectric plate 11, which are both end portions of the piezoelectric plate 11 in the longitudinal direction.

According to the structure, the rectangular piezoelectric plate 11 is supported by the pair of mount portions 21 and 22 formed in one end portions of the piezoelectric plate 11 in the short direction at the time of mounting the piezoelectric vibrating reed 10, therefore, the moment around the mount portions 21 and 22 is reduced as compared with a case where the rectangular shaped piezoelectric plate 11 is supported in one end portions of the longitudinal direction as in the related-art structure. As the stress applied to the mount portions 21 and 22 is reduced by the above structure, it is possible to suppress damage occurring in the mount portions 21 and 22 even when the mount portions 21 and 22 are reduced in size due to the size reduction of the piezoelectric vibrating reed 10 and the fixing force is reduced at the time of mounting. Therefore, the small-sized piezoelectric vibrating reed 10 with excellent durability can be obtained.

Additionally, the distance between the mount portions 21, 22 and the excitation electrodes 34 is longer than the structure in which the mount portions are provided in the vicinity of the center of the short direction in the vibrating plate. Accordingly, the propagation distance of vibration generated in the vibrating portion 12 to the mount portions 21 and 22 can be extended, therefore, the vibration generated in the vibrating portion 12 can be sufficiently attenuated and the problem of so-called vibration leakage in which vibration energy is leaked from the mount portions 21 and 22 to the outside can be reduced.

The piezoelectric plate 11 is formed of the AT-cut quartz substrate, and the longitudinal direction of the piezoelectric plate 11 extends along the Z' axis direction. Here, the thickness slip vibration which is a main vibration mode of the AT-cut quartz substrate is the vibration largely displaced in the X axis direction. Accordingly, when the piezoelectric vibrating reed 10 is cantilever-supported at two points along the Z' axis direction orthogonal to the X axis direction, the mount portions 21 and 22 do not prevent the displacement of the vibrating portion 12 in the X axis direction. When the mount portions prevent the displacement of the vibrating portion, unnecessary vibration tends to occur in the vibrating portion and the mount portions, as a result, it becomes difficult to obtain desired vibration characteristics. According to the structure of the embodiment, the arrangement direction of the mount portions 21 and 22 is orthogonal to the displacement direction of the vibrating portion 12, therefore, it is possible to remarkably reduce the occurrence of unnecessary vibration as compared with the case where these directions are the same direction.

As the external dimension of the piezoelectric plate 11 in the longitudinal direction is 1.4 times or less of the external dimension of the piezoelectric plate 11 in the short direction, the piezoelectric vibrating reed 10 is suitable to be mounted on, for example, a small-sized package having an approximately square shape in plan view.

As the piezoelectric vibrator 1 according to the embodiment includes the piezoelectric vibrating reed 10 and the package 5 on which the mount portions 21 and 22 of the piezoelectric vibrating reed 10 are mounted, the small-sized piezoelectric vibrator 1 with excellent durability can be obtained.

Second Embodiment

Next, a piezoelectric vibrator and a piezoelectric vibrating reed according to a second embodiment will be explained.

Figure 4:
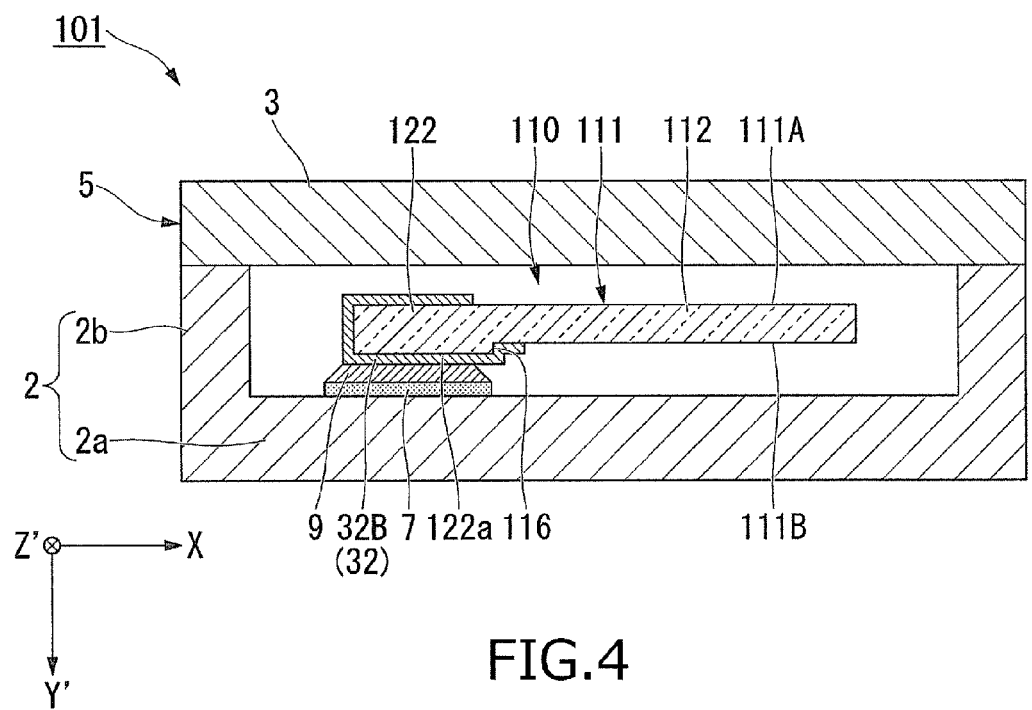
FIG. 4 is a cross-sectional view of a piezoelectric vibrator according to a second embodiment.
Figure 5:
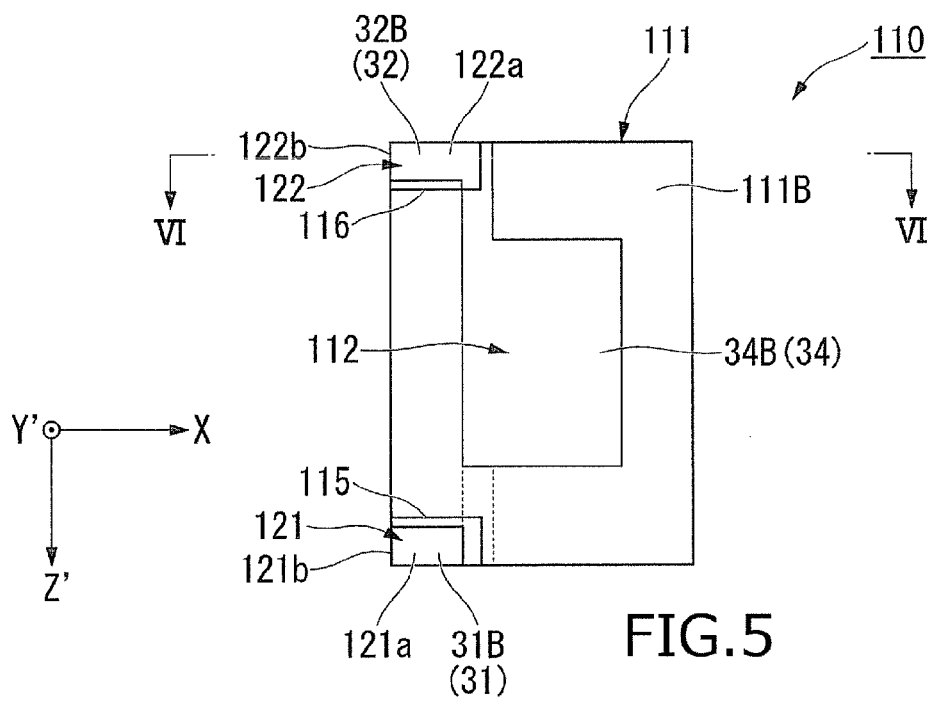
FIG. 5 is a bottom view of a piezoelectric vibrating reed according to the second embodiment.

FIG. 4 is a cross-sectional view of a piezoelectric vibrator according to a second embodiment, which is the cross-sectional view of a portion taken along III-III line of FIG. 2. FIG. 5 is a bottom view of a piezoelectric vibrating reed according to the second embodiment.

The piezoelectric vibrating reed 110 according to the second embodiment shown in FIG. 4 and FIG. 5 differs from the piezoelectric vibrating reed 10 according to the first embodiment in a point that a vibrating portion 112 is formed to be thinner than mount portions 121 and 122. The same symbols are given to the same components as those of the first embodiment and detailed explanation is omitted (the same applies to the following embodiments).

As shown in FIG. 4, a piezoelectric vibrator 101 includes the piezoelectric vibrating reed 110 mounted on the package 5 through the mount member 9. As the mount member 9, a conductive adhesive, a paste and so on can be adopted.

As shown in FIG. 4 and FIG. 5, the piezoelectric plate 111 included in the piezoelectric vibrating reed 110 has a first mount portion 121 and a second mount portion 122 formed so as to be one step higher than the other principal surface 111B in the vibrating portion 112 in a +Y' axis direction.

The first mount portion 121 is prescribed in a rectangular shape in plan view by side surfaces of the piezoelectric plate 111 and a step portion 115. The step portion 115 is continuously formed in the +X axis side and the −Z' axis side seen from the first mount electrode 31B around the first mount electrode 31B. A principal surface 121a of the first mount portion 121 is formed in parallel to the other principal surface 111B of the piezoelectric surface 111.

The second mount portion 122 is prescribed in a rectangular shape in plan view by side surfaces of the piezoelectric plate 111 and a step portion 116. The step portion 116 is continuously formed in the +X axis side and the +Z' axis side seen from the second mount electrode 32B around the first mount electrode 32B. A principal surface 122a of the second mount portion 122 is formed in parallel to the other principal surface 111B of the piezoelectric surface 111.

The vibrating portion 112 is formed to be thinner than the mount portions 121 and 122 around the mount portions 121 and 122.

As shown in FIG. 4, the piezoelectric vibrating reed 110 is mounted in a state where the other principal surface 111B of the piezoelectric plate 111 faces the bottom wall portion 2a of the base substrate 2. At this time, the principal surface 121a of the first mount portion 121 and the principal surface 122a of the second mount portion 122 are mounted on the internal electrodes 7 of the package 5 through the mount member 9.

As described above, in the piezoelectric vibrating reed 110 according to the embodiment, the vibrating portion 112 is formed to be thinner than the mount portions 121 and 122 around the mount portions 121 and 122. Accordingly, the piezoelectric vibrating reed 110 can alleviate the stress acting on the mount portions 122 and 122 by the vibrating portion 112 which is formed to be thinner even when the moment around the mount portions 121 and 122 is generated in a state of being mounted on the package 5. Therefore, the piezoelectric vibrating reed 110 with more excellent durability can be obtained.

Moreover, the mount member 9 is allowed to contact the principal surfaces 121a and 122a of the mount portions 121 and 122 which are one step higher than the other principal surface 111B when the piezoelectric vibrating reed 110 is mounted on the package 5, thereby preventing the mount member 9 from leaking and spreading from the principal surfaces 121a and 122a and adhering to the vibrating portion 112. Accordingly, it is possible to suppress variations in vibration characteristics of the piezoelectric vibrating reed 110.

The piezoelectric vibrating reed 110 is mounted on the package 5 so that the mount member 9 is allowed to contact the principal surfaces 121a and 122a of the mount portions 121 and 122 in the other principal surface 111B side of the piezoelectric plate 111 in the embodiment, however, the present invention is not limited to this. The piezoelectric vibrator 110 may be configured so that the mount member 9 is allowed to contact the principal surfaces of the mount portions 121 and 122 in one principal surface 111A side of the piezoelectric plate 111. In this case, it is possible to obtain the effect of alleviating the stress acting on the mount portions 121 and 122 in the vibrating portion 112.

Although the mount portions 121 and 122 protrude to only one direction in the thickness direction (Y' axis direction) of the piezoelectric plate 111 in the embodiment, the present invention is not limited to this.

Figure 6:
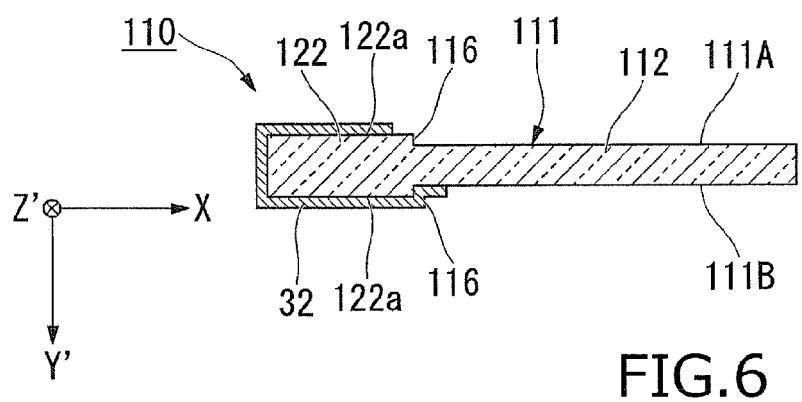
FIG. 6 is a cross-sectional view of another piezoelectric vibrating reed according to the second embodiment.
Figure 7:
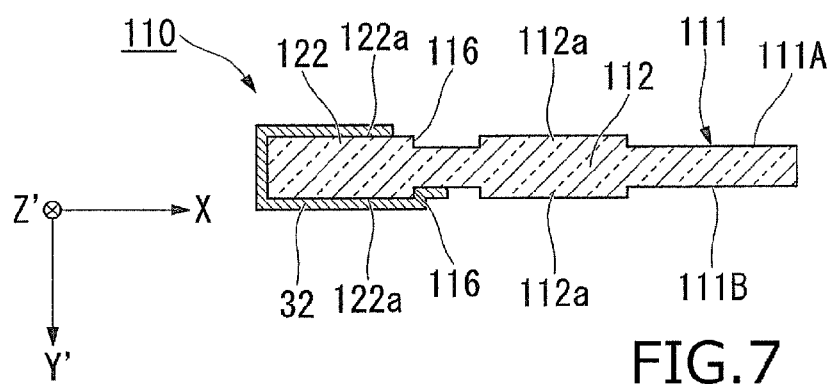
FIG. 7 is a cross-sectional view of another piezoelectric vibrating reed according to the second embodiment.

FIG. 6 and FIG. 7 are cross-sectional views of other piezoelectric vibrating reeds according to the second embodiment, which are cross-sectional views of a portion taken along VI-VI line of FIG. 5.

As shown in FIG. 6, the mount portions 121 and 122 may be one step higher than the one principal surface 111A and the other principal surface 111B of the vibrating portion 112, respectively. According to the structure, the mount member 9 is allowed to contact the principal surfaces 121a and 122a of the mount portions 121 and 122 which are one step higher when any of the both principal surfaces 111A and 111B faces the bottom wall portion 2a of the base substrate 2 when the piezoelectric vibrating reed 110 is mounted on the package 5. Therefore, the manufacturing efficiency of the piezoelectric vibrator 101 is improved, and the piezoelectric vibrator 101 can be manufactured at low costs.

As shown in FIG. 7, the piezoelectric vibrating reed 110 may be a so-called mesa-type piezoelectric vibrating reed in which the vibrating portion 112 has a thick walled portion 112a protruding from both principal surfaces 111A and 111B of the piezoelectric plate 111. In this case, the thick wall portion 112a and the mount portions 121 and 122 are formed so as to protrude from the both principal surfaces 111A and 111B of the piezoelectric plate 111 independently. Accordingly, the piezoelectric vibrating reed 110 can confine the vibration energy inside the thick wall portion 112a and can suppress propagation of vibration to the mount portions 121 and 122 in addition to the above operations and effects. Although the one-step mesa shape is shown as the thick wall portion 112a in FIG. 7, the present invention is not limited to this. A shape having plural steps of mesa portions may be adopted as the thick wall portion 112a. It is also possible to adopt a structure in which the thick wall portion 112a is formed at least one principal surface of both principal surfaces 111A and 111B.

Although heights of the thick wall portion 112a, the mount portions 121 and 122 are not particularly limited in the piezoelectric vibrating reed 110 shown in FIG. 7, it is preferable that the thick wall portion 112a, the mount portions 121 and 122 have the same height. According to the structure, the thick wall portion 112a, the mount portions 121 and 122 can be formed at the same time as the piezoelectric plate 111 is formed, which can simplifies the manufacturing process.

Although the principal surface of the thick wall portion 112a is formed to be one step higher than both principal surfaces 111A and 111B of the piezoelectric plate 111 in the piezoelectric vibrating reed 110 shown in FIG. 7, however, the principal surface of the thick wall portion may be formed to be higher than both principal surfaces 111A and 111B of the piezoelectric plate 111 by multiple steps.

Modification Example of Second Embodiment

Next, a piezoelectric vibrator 201 according to a modification example of the second embodiment will be explained.

Figure 8:
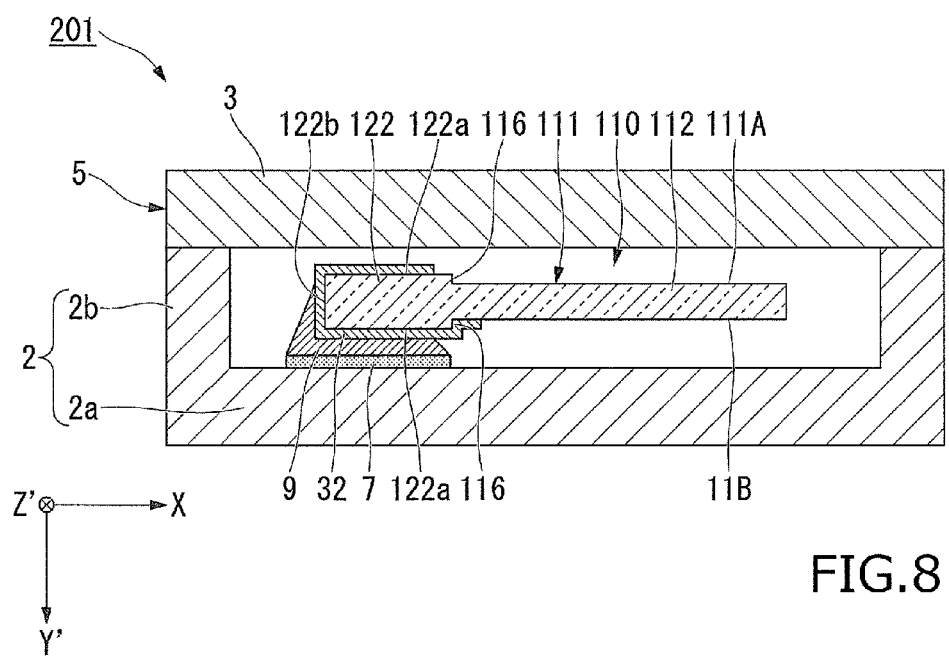
FIG. 8 is a cross-sectional view of the piezoelectric vibrator according to a modification example of the second embodiment.

FIG. 8 is a cross-sectional view of the piezoelectric vibrator according to a modification example of the second embodiment, which is the cross-sectional view of a portion taken along III-III line of FIG. 2.

In the piezoelectric vibrator 101 according to the second embodiment shown in FIG. 4, the mount member 9 is allowed to contact only the principal surfaces 121a and 122a of the mount portions 121 and 122 of the piezoelectric vibrating reed 110. In response to this, the piezoelectric vibrator 201 according to the modification example shown in FIG. 8 differs from the second embodiment in a point that the mount member 9 is allowed to contact the principal surfaces 121a, 122a and the side surfaces 121b, 122b (see FIG. 5) of the mount portions 121 and 122 of the piezoelectric vibrating reed 110. The same symbols are given to the same components as those of the second embodiment and detailed explanation is omitted.

As shown in FIG. 8, in the piezoelectric vibrator 201, the piezoelectric vibrating reed 110 is mounted on the package 5 through the mount member 9. In the piezoelectric vibrator 201, the mount member 9 contacts the area from the principal surfaces 121a and 122a in the mount portions 121 and 122 of the piezoelectric vibrating reed 110 to the side surfaces 121b and 122b in the mount portions 121 and 122.

As described above, the piezoelectric vibrator 201 according to the modification example includes the mount member 9 contacting the principal surfaces 121a, 122a of the mount portions 121, 122 and the side surfaces 121b, 122b of the mount portions 121, 122. According to the structure, the piezoelectric vibrating reed 110 is fixed from at least two directions by the mount member 9, therefore, the piezoelectric vibrating reed 110 and the mount member 9 firmly fixed to each other are hardly peeled off. Therefore, the piezoelectric vibrator 201 with more excellent durability can be obtained.

Third Embodiment

Next, a piezoelectric vibrating reed according to a third embodiment will be explained.

Figure 9:
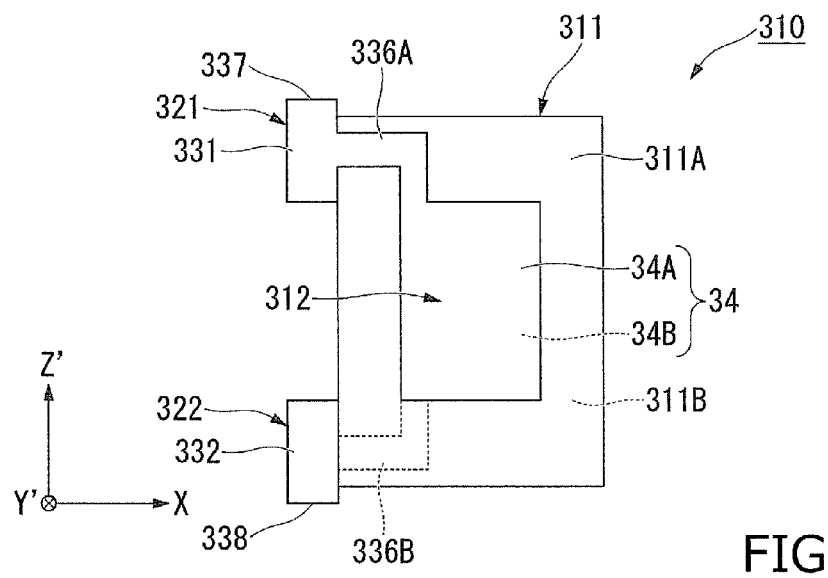
FIG. 9 is a plan view of a piezoelectric vibrating reed according to a third embodiment.

FIG. 9 is a plan view of the piezoelectric vibrating reed according to the third embodiment.

A piezoelectric vibrating reed 310 shown in FIG. 9 differs from the piezoelectric vibrating reed 10 according to the first embodiment in a point that mount portions 321 and 322 protrude from a piezoelectric plate 311 along a plane direction (XZ' plane direction) of the piezoelectric plate 311.

As shown in FIG. 9, the piezoelectric plate 311 includes a vibrating portion 312 having a rectangular shape in plan view and a pair of mount portions 321 and 322 protruding from the piezoelectric plate 311.

The pair of mount portions 321 and 322 are formed in one end portions of the piezoelectric plate 11 in the short direction (X axis direction), which are both end portions of the longitudinal direction (Z' axis direction). That is, the mount portions 321 and 322 are formed so as to protrude from corners apart from each other in the longitudinal direction toward the outer side of the piezoelectric plate 311 in a plane direction.

Although the mount portions 321 and 322 have a rectangular shape seen from an upper surface, the shape of the mount portions 321 and 322 is not limited to this. The mount portions 321 and 322 may have a parallelogram shape extending from the corners of the piezoelectric plate 311 to a (−X, +Z') direction and a (−X, −Z') direction. The mount portions may be mounted on the base substrate 2 at tip ends of the parallelogram shape. In this case, the distance between a mounting position of the piezoelectric vibrating reed 310 and the vibrating portion 312 can be further increased, the possibility that vibration leaks to the base substrate 2 at the mounting position can be reduced.

The first mount portion 321 is arranged so as to contact a side surface of the vibrating portion 312 facing the −X axis direction in a corner positioned in the (−X, +Z') direction of the vibrating portion 312. The first mount portion 321 is arranged so as to protrude from a side surface of the vibrating portion 312 facing the +Z' direction to the +Z' axis direction.

The first mount portion 321 includes a first mount electrode 331 formed on a principal surface and a first side surface electrode 337 formed on a side surface. The first mount electrode 331 and the first side surface electrode 337 are formed so as to cover the entire surface of the first mount portion 321. The first mount electrode 331 is connected to one excitation electrode 34A formed in the vibrating portion 312 on one principal surface 331A of the vibrating plate 331 through a lead wiring 336A.

The second mount portion 322 is arranged so as to contact the side surface facing the −X axis direction of the vibrating portion 312 at a corner positioned in the (−X, −Z') direction of the vibrating portion 312. The second mount portion 322 is arranged so as to protrude from a side surface of the vibrating portion 312 facing the −Z' direction to the −Z' axis direction.

The second mount portion 322 includes a second mount electrode 332 formed on a principal surface and the second side surface electrode 338 formed on a side surface. The second mount electrode 332 is formed so as to cover the entire surface of the second mount portion 322. The second mount electrode 332 is connected to the other excitation electrode 34B formed in the vibrating portion 312 on the other principal surface 331B of the vibrating plate 331 through a lead wiring 336B.

As described above, in the piezoelectric vibrating reed 310 according to the embodiment, the mount portions 321 and 322 protrude from the piezoelectric plate 311 along the plane direction (XZ' plane direction) of the piezoelectric plate 311. According to the structure, the mount portions 321 and 322 protrude from the piezoelectric plate 311, therefore, it is possible to suppress the mount member 9 which has leaked and spread adhering to the piezoelectric plate 311, particularly to the vibrating portion 312. Accordingly, variations in vibration characteristics of the piezoelectric vibrating reed 310 can be suppressed.

The mount portions 321 and 322 may be formed one step higher than the other principal surface 311B of the piezoelectric plate 311 in the +Y' direction in the same manner as the mount portions 121 and 122 of the piezoelectric vibrating reed 110 shown in FIG. 5. According to the structure, it is possible to surely suppress the mount member leaking and spreading to the vibrating portion 312 at the time of mounting the piezoelectric vibrating reed 310. As explained with reference to FIG. 7, the piezoelectric vibrating reed 310 may have the so-called mesa shape by providing the thick wall portion in both principal surfaces 311A and 311B of the vibrating portion 312. In that case, the thickness of the mount portions 321, 322 may be the same thickness as the thick wall portion (distance between front and back top surfaces of the thick wall portion). Further in that case, the mount member 9 may contact at least one of the principal surfaces, the inner side surface and the outer side surface of the mount portions 321, 322. Accordingly, the mounting strength of the piezoelectric vibrating reed 310 is improved and the piezoelectric vibrator 301 with excellent durability can be obtained.

The present invention is not limited to the above embodiments explained with reference to the drawings, and various modification examples can be considered in a technical scope thereof.

For example, the piezoelectric vibrating reed with the flat-plate vibrating portion and the so-called mesa-type piezoelectric vibrating reed are used in the above embodiments, however, the present invention is not limited to them. For example, a so-called beveled-type or convex-type piezoelectric vibrating reed may be used.

Figure 10:
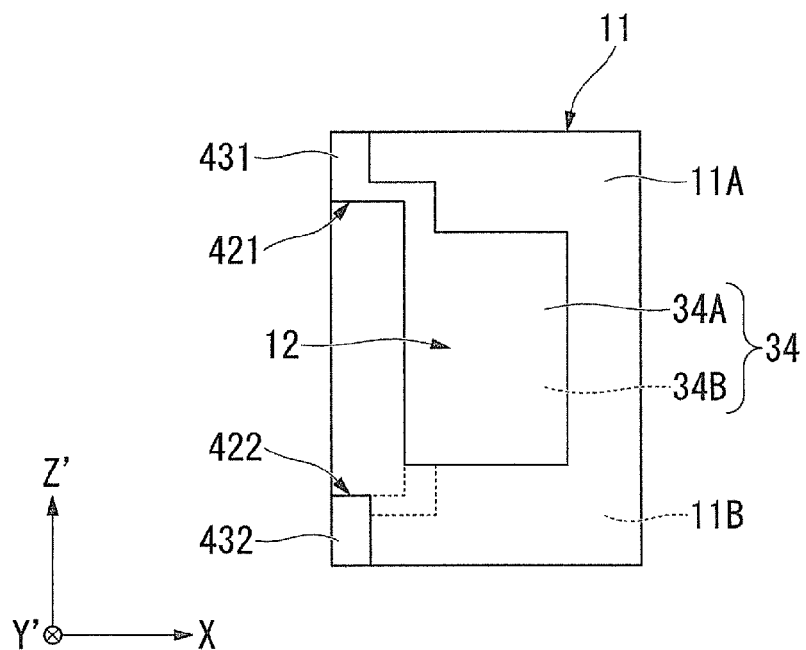
FIG. 10 is a plan view showing another structure of the piezoelectric vibrating reed.
Figure 11:
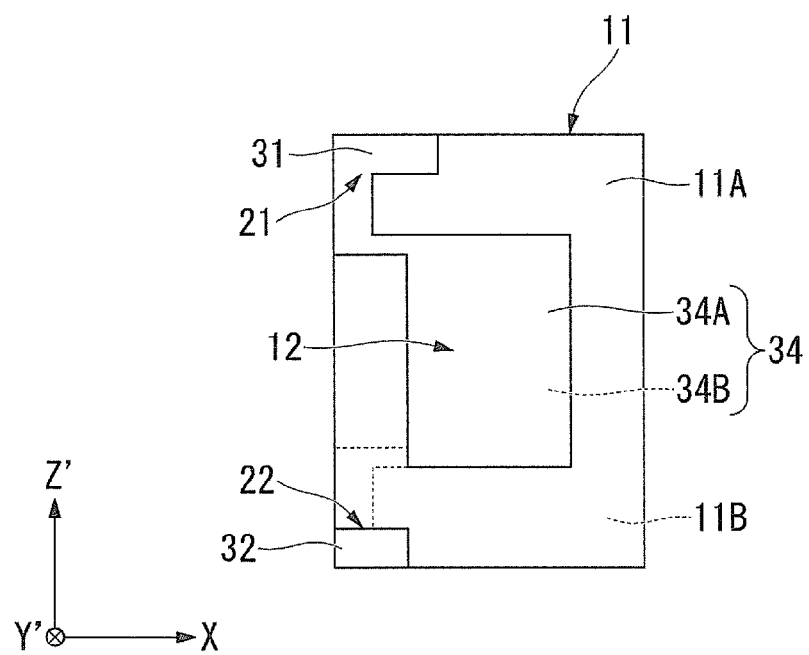
FIG. 11 is a plan view showing another structure of the piezoelectric vibrating reed.

The electrode pattern formed on the piezoelectric plate is not limited to the above pattern. For example, mount electrodes 431 and 432 may have a shape extending to the Z' axis direction as shown in FIG. 10 (the shape in which the size in the X axis direction is larger than the size in the Z' axis direction). In such structure, the mount electrodes 431 and 432 are extended in a direction orthogonal to the displacement direction of the vibrating portion 12, therefore, the mounting area of the mount portions 421 and 422 can be increased without reducing vibration characteristics. Moreover, when the excitation electrode 34 is connected to the mount electrode 31 and 32, a pattern in which the electrode is extended from the excitation electrode 34 in the X axis direction first, then, the electrode is connected to the mount electrodes 31 and 32 along the Z' axis direction may be adopted. In this case, the distance on the electrode from the excitation electrode 34 to the mount electrodes 31 and 32 can be extended as compared with the pattern shown in FIG. 1, therefore, the vibration energy propagating along the electrodes can be sufficiently attenuated. Accordingly, the problem of the vibration leakage can be reduced.

Furthermore, in the above embodiment, the Z' axis direction in crystal axes of quartz crystal is set as the longitudinal direction of the piezoelectric plate, however, the X axis direction in crystal axes of quartz crystal may be set as the longitudinal direction. In this case, mount portions having a rectangular shape or a parallelogram shape protruding to the plane direction of the piezoelectric plate may be formed at both end portions of +Z' axis side and −Z' axis side in the −X axis side.

Furthermore, the mount portions 421 and 422 may be formed not only in the vicinity of the corners in one end portions in the short direction of the piezoelectric plate but also in one end portion side and the other end portion side in the short direction. That is, the mount portions 421 and 422 may be formed so as to be positioned at diagonal positions.

Additionally, it is also possible to appropriately replace the components in the above embodiments with well-known components within a scope not departed from the gist of the present invention.

What is claimed is:

1. A piezoelectric vibrating reed comprising:
   a piezoelectric plate having a rectangular shape, such that a longitudinal direction is greater than a short direction orthogonal to the longitudinal direction;
   a vibrating portion on a principal surface of the piezoelectric plate; and
   first and second mount portions integral with the piezoelectric plate and configured to mount the piezoelectric plate, the mount portions separated in the longitudinal direction,
   wherein the first mount portion resides at a first end of the piezoelectric plate and the second mount portion resides at a second end of the piezoelectric plate in the longitudinal direction.

2. The piezoelectric vibrating reed according to claim 1, wherein each of the first and second mount portions reside in the vicinity of corners at opposite ends of the piezoelectric plate in the longitudinal direction.

3. The piezoelectric vibrating reed according to claim 1, wherein a thickness of the vibrating portion is less than a thickness of the first and second mount portions, at least in a region in proximity to the first and second mount portions.

4. The piezoelectric vibrating reed according to claim 1, wherein the piezoelectric plate is an AT-cut quartz substrate, and the longitudinal direction of the piezoelectric plate extends along a Z' axis direction of the AT-cut quartz substrate.

5. The piezoelectric vibrating reed according to claim 1, wherein an external dimension of the piezoelectric plate along the longitudinal direction is at most 1.4 times an external dimension of the piezoelectric plate along a short direction orthogonal to the longitudinal direction.

6. The piezoelectric vibrating reed according to claim 1, wherein the first and second mount portions protrude from the piezoelectric plate along a plane direction of the piezoelectric plate.

7. A piezoelectric vibrator comprising:
   the piezoelectric vibrating reed according to claim 1; and
   a package having the first and second mount portions of the piezoelectric vibrating reed bonded thereto.

8. The piezoelectric vibrator according to claim 7, further comprising:
   a mount member between the first and second mount portions of the piezoelectric vibrating reed and the package,
   wherein the mount member contacts principal surfaces of the first and second mount portions and side surfaces of the mount portions.

* * * * *